United States Patent [19]

McConnell

[11] Patent Number: 5,206,864
[45] Date of Patent: Apr. 27, 1993

[54] CONCATENATED CODING METHOD AND APPARATUS WITH ERRORS AND ERASURES DECODING

[75] Inventor: Peter R. H. McConnell, Burnaby, Canada

[73] Assignee: Motorola Inc., Schaumburg, Ill.

[21] Appl. No.: 622,073

[22] Filed: Dec. 4, 1990

[51] Int. Cl.⁵ .................... G06F 11/10; H03M 13/00
[52] U.S. Cl. .................................. 371/37.4; 371/38.1
[58] Field of Search ............................ 371/37.4, 38.1

[56] References Cited

U.S. PATENT DOCUMENTS

| | | | |
|---|---|---|---|
| 3,638,182 | 1/1972 | Burton et al. | 371/38.1 |
| 3,831,143 | 8/1974 | Trafton | 371/37.4 |
| 4,907,233 | 3/1990 | Deutsch et al. | 371/37.4 |

OTHER PUBLICATIONS

Peterson and Weldon, Jr., Error Correcting Codes–2nd Edition, The MIT Press, 1972, pp. 139–141.

Primary Examiner—Charles E. Atkinson
Attorney, Agent, or Firm—Donald B. Southard

[57] ABSTRACT

An apparatus and method for significantly increasing the coding gain of a system used for data communications while still maintaining a high code rate (net data rate/gross data rate) and throughput by using a concatenated coding arrangement wherein error correction capabilities are optimized, having an encoder for encoding data to be transmitted with a first code type to form an outer code which is capable of correcting burst errors and further detecting if the remaining data is error free, and for encoding the data and the outer code with a second code type to form an inner code which is capable of correcting random errors and detecting multiple bit errors.

7 Claims, 2 Drawing Sheets

CONCATENATED CODING METHOD AND APPARATUS WITH ERRORS AND ERASURES DECODING

FIELD OF THE INVENTION

The present invention relates to coding methods, and more particularly to coding methods with powerful error detection and correction capability.

BACKGROUND OF THE INVENTION

Any system transmitting data in a mobile or portable radio environment is subject to both random and burst errors, requiring the use of an error detection and correction technique which provides protection from both.

Many coding schemes exist wherein data which is to be transmitted over a wireline or over a radio link is encoded in such a fashion as to reduce the number of errors received at a receiving user's terminal. Data to be transmitted is usually conveniently arranged into groups of bits representing a character. Error codes include parity bits sent with each group of bits, which in their most elementary form indicate whether one bit of the group of bits is in error, without determining which one, to much more powerful coding techniques which not only detect errors, but which also allow correction of multiple bit errors.

Since the strength of the signal transmitted (and received) affects the number of errors in the received signal, the degree of protection provided by the error detection and correction technique determines the required transmit power levels used, and in turn has a significant impact on portable terminal battery requirements and portable terminal size and weight. The more robust the error detection and correction algorithm employed, the smaller and lighter the portable terminal can be.

Error detection and correction codes typically comprise the use of a rearrangement in the bit sequences of the message in order to limit the damage to the received message due to a "burst error" or an error which destroys several consecutive bits of data (bit interleaving, for example), or the use of additional bits transmitted with the message which may be used to determine whether errors in the received message exist, and, in some cases, to correct such errors. However, the error detection and correction algorithm must not be inefficient, or radio channel throughput will suffer. Also the algorithm should be simple enough to implement on readily available 8 bit and 16 bit microprocessors, such that the microprocessors can keep up with the data received from the channel.

Most existing portable and mobile radio data systems require a channel bit error rate of 1% or less to achieve reliable communications. To achieve such low bit error rates, data must be transmitted at relatively slow rates, which decreases the amount of information which can be transmitted on a radio channel (or on a single wire line in the case of a landline data transmission network), or the power of the transmitter must be increased to be able to overcome noise and the like which may be the cause of the errors. In the case of portable radio data systems, increased power creates significant problems with respect to power consumption, and, thereby, battery life.

If an error detection and correction scheme could be implemented which allowed reliable, accurate communications while tolerating a bit error rate of 10%, such a system would allow reduced output power by about 50% in the transmit mode, thus reducing current consumption (particularly critical for portables) by about 50% in the transmit mode. Alternatively, an increased coverage area could be obtained.

The present invention provides such an error detection and correction scheme.

SUMMARY OF THE INVENTION

The instant invention provides a means and method for significantly increasing the coding gain of a system used for data communications while still maintaining a high code rate (net data rate/gross data rate) and throughput by using a concatenated coding arrangement wherein error correction capabilities are optimized, comprising, encoding data to be transmitted with a first code type to form an outer code which is capable of correcting burst errors and further detecting whether the remaining data is error free, and encoding the data and the outer code with a second code type to form an inner code which is capable of correcting random errors and detecting multiple bit errors. In a preferred embodiment, the outer code is a Reed-Solomon type code and the inner code is a form of Hamming code.

DESCRIPTION OF A PREFERRED EMBODIMENT

In a typical digital data transmission system, the data is arranged into groups of bits, each group representing a character. As an example only, and for purposes of this discussion, a six-bit group will be assumed. A complete message may comprise any number of groups of bits, or characters, which may be further arranged into packets of information of an arbitrary length. For purposes of this discussion, a packet length of 45 characters will be assumed.

When a message comprised of one or more packets of data is transmitted from one terminal to another, either by radio waves or wireline communications, the transmission is subject to the effects of fading (in the case of radio waves), uneven line characteristics (in the case of wireline transmission), and to interference or noise (in either case). In order to provide a mechanism for ensuring the accuracy of data as it is received at a terminal or base station, each character, packet, or message, or all three, are provided with error detection and correction protection, typically in the form of additional bits which are interleaved within the transmitted data or appended thereto.

These additional bits allow the receiving terminal to examine the data and to determine whether any errors are present in it, and in some cases allow the correction of certain errors. Many coding schemes are known for accomplishing this end. Each scheme has its own overhead associated with it (e.g., the number of extra bits to be transmitted, or the encoding or decoding algorithm complexity.) Different coding schemes also vary in their power to detect, mark, or correct errors of various kinds, for example, single bit errors or burst errors (in which a number of successive bits are altered or destroyed.)

It is known to utilize multiple coding techniques on the same data to increase the power of the overall error correction and detection. One known way of utilizing multiple coding techniques is to concatenate two or more coding techniques, by first encoding the data using one technique, and then encoding both the original data and the first code with a second code. In known concatenated coding techniques, the full power of the technique has not been realized. The use of concatenated error detection and correction codes has been suggested, for example, by Michelson and Levesque, in "Error Control Techniques for Digital Communication", (John Wiley and Sons, page 161) who used an inner code of a concatenated coding scheme to flag errors, and the outer code to correct burst errors and such flagged errors. In that case, parity was used as the inner code.

It has been discovered that if one encodes data with a powerful outer code for correcting burst errors and suspected erroneous code, (erasures, marked or flagged errors) and an inner code for correcting random errors and detecting and marking multiple bit errors or suspected errors, the resulting concatenated code is more robust than prior concatenated codes.

Figure 1:
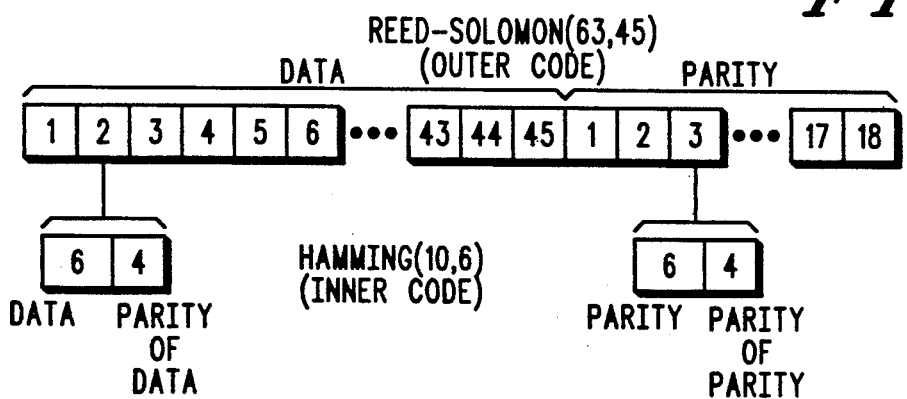
FIG. 1 is a symbolic representation of a coding scheme, according to a preferred embodiment of the invention.

FIG. 1 is a symbolic representation of a coding scheme according to a preferred embodiment of the invention. In a preferred embodiment, the instant invention uses a concatenated coding scheme, with a Hamming (10,6) code as the inner code and a Reed-Solomon (33,15) code as the outer code. As can be seen from FIG. 1, a data packet is comprised of 45 six bit characters. The application of a Reed-Solomon (63,45) code to the 45 data characters requires the addition of eighteen parity words (thus making 63 words in all. The Reed-Solomon code is an excellent code for correcting burst errors and for detecting whether the remainder of the data is good.

The 63 data and parity characters are then encoded with a modified Hamming (10,6) Code which, as can be seen from FIG.1, applies four parity bits to each data and parity character. It should be pointed out that while specific code dimensions are shown here, others can be used depending upon character size, packet size, coding power, etc., desired. The modified Hamming code is an excellent code for detection and correction of errors. Ordinary Hamming codes usually detect single bit errors. This particular Hamming code, which will be described later, corrects single bit errors and detects multi-bit errors.

In operation, upon receipt of a message the Hamming inner code is used to correct single bit errors and mark suspect symbols, and the Reed-Solomon outer code is used as an errors and erasures decoder. The Reed-Solomon outer code can correct twice as many erasures (symbols which are known to be incorrect) as errors (where the location of the incorrect symbol is not known), so using the Hamming inner code to mark suspect symbols effectively doubles the correcting power of the code, while also providing protection from single bit errors.

The use of a Reed-Solomon code as the outer code in a concatenated coding scheme is common, as the Reed-Solomon codes are maximum distance separable. They make very efficient use of the parity bits, the block lengths and symbol sizes can be readily adjusted to accommodate a wide range of message sizes, and they have very large coding gains. The specific Reed-Solomon code used here is a (63,45) code which may be shortened to (33,15).

A primary aspect of this invention is the use of the Hamming code as the inner code. Concatenated codes using Reed-Solomon outer codes and linear block codes or bit interleaving codes as inner codes are common, but these suffer from low code rates, generally less than 0.25. The Hamming code used in this case is a (15,11) code shortened to (10,6), which provides the capability of correcting all single bit errors and detecting most double bit errors, as well as many higher bit error combinations. The use of the Hamming (10,6) code as the inner code results in a higher code rate than other techniques.

The particular Hamming (10,6) code generator matrix G and parity check matrix H of the preferred embodiment are chosen as follows:

$$G = \begin{vmatrix} 1\,0\,0\,0\,0\,0:1\,1\,1\,0 \\ 0\,1\,0\,0\,0\,0:1\,1\,0\,1 \\ 0\,0\,1\,0\,0\,0:1\,0\,1\,1 \\ 0\,0\,0\,1\,0\,0:0\,1\,1\,1 \\ 0\,0\,0\,0\,1\,0:0\,0\,1\,1 \\ 0\,0\,0\,0\,0\,1:1\,1\,0\,0 \end{vmatrix} \quad (3\text{-}1)$$

$$H = \begin{vmatrix} 1\,1\,1\,0\,0\,1:1\,0\,0\,0 \\ 1\,1\,0\,1\,0\,1:0\,1\,0\,0 \\ 1\,0\,1\,1\,1\,0:0\,0\,1\,0 \\ 0\,1\,1\,1\,1\,0:0\,0\,0\,1 \end{vmatrix} \quad (3\text{-}2)$$

Normally all the columns of the parity check matrix would have odd weight, but a (10,6) Hamming code with odd weight cannot be generated from a (15,11) code. The best that can be achieved is to start with a larger code such as (63,57), and shorten it to a (12,6) code. The disadvantage to this is that the code rate is reduced to a value of 0.50.

By careful selection of the column vectors in the parity check matrix, a (10,6) Hamming code can be constructed which has a code rate of 0.60 and can detect and correct all single bit errors, as well as detect a large percentage of error patterns with 2 or more errors.

Figure 2:
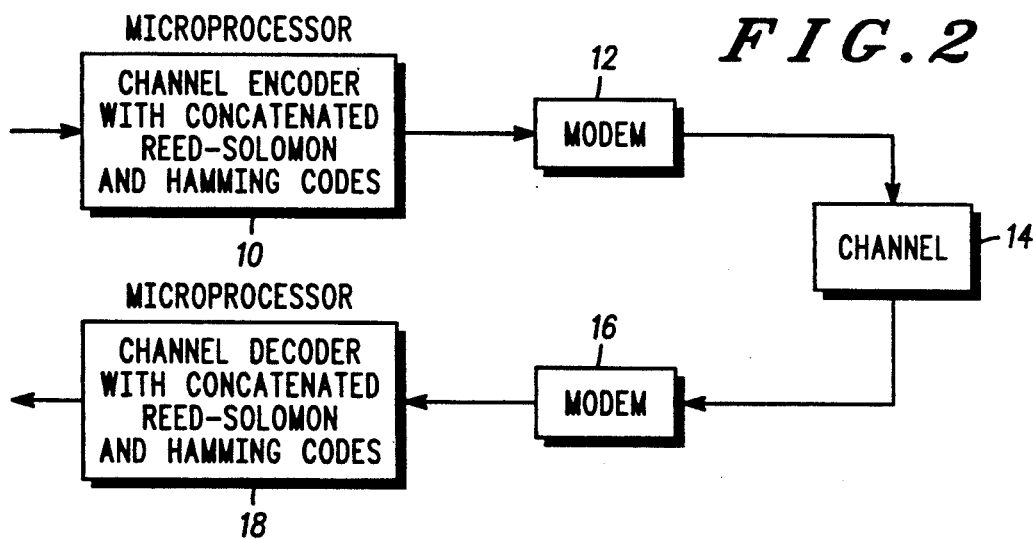
FIG. 2 is a block diagram of a system according to a preferred embodiment of the invention.

FIG. 2 is a block diagram of a system according to a preferred embodiment of the invention. FIG. 2 shows a microprocessor 10 which contains software as such that it can encode the channel with a Reed-Solomon and Hamming code. The output of the microprocessor is fed to a modem 12 and the encoded data is sent over a channel 14, which may be a radio channel or a wireline channel to a receiving modem 16. The receiving modem 16 passes the encoded data to a microprocessor 18 with software to allow it to perform as a channel decoder for decoding the Reed-Solomon and Hamming codes.

Figure 3:
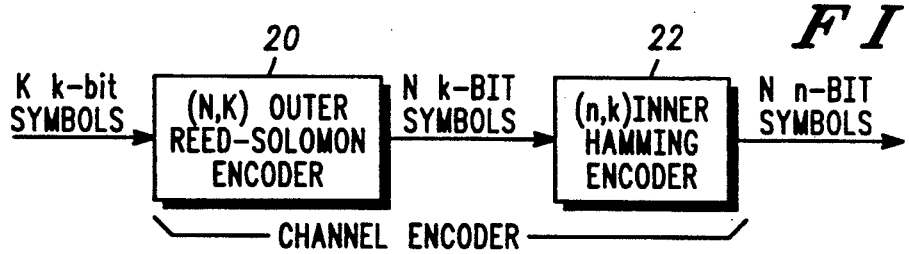
FIG. 3 is a block diagram of the channel encoder of FIG. 2.

FIG. 3 is a block diagram of the channel encoder of FIG. 2. As noted, the channel encoder 20 function can be performed by the microprocessor 10, and in operation it first receives a number of six bit symbols, in the preferred embodiment, forming a character or parity word, and encodes the symbols with the Reed-Solomon code as shown in FIG. 1. The Reed-Solomon encoded data and parity characters are then operated upon by the microprocessor as shown in block 22 where the Hamming code is applied to the already encoded data and parity.

Figure 4:
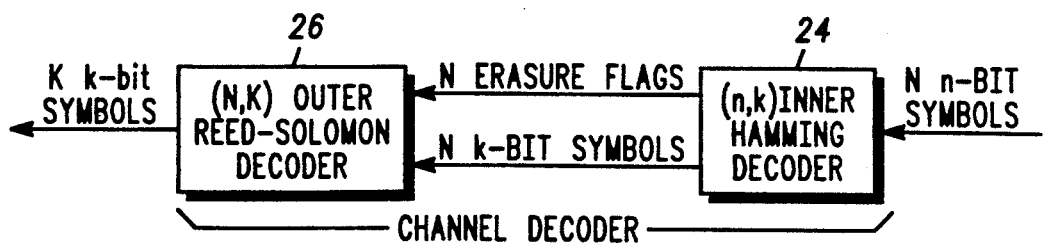
FIG. 4 is a block diagram of the channel decoder of FIG. 2.

FIG. 4 shows the comparable channel decoder. It receives the encoded symbols in a Hamming decoder 24, which, again, can be performed by a properly programmed microprocessor 18, and the Hamming decoder 24 decodes the data stream to produce a number of six bit symbols of data and parity and also produces erasure flags which indicate bits which are believed to be in error. The erasure flags and the six bit symbols are then operated upon by the microprocessor 18 or a Reed-Solomon decoder 26 to decode the Reed-Solomon code to produce corrected code identical to the input code. The Reed-Solomon code can also determine if the received data contains more errors than it is capable of correcting.

Figure 5:
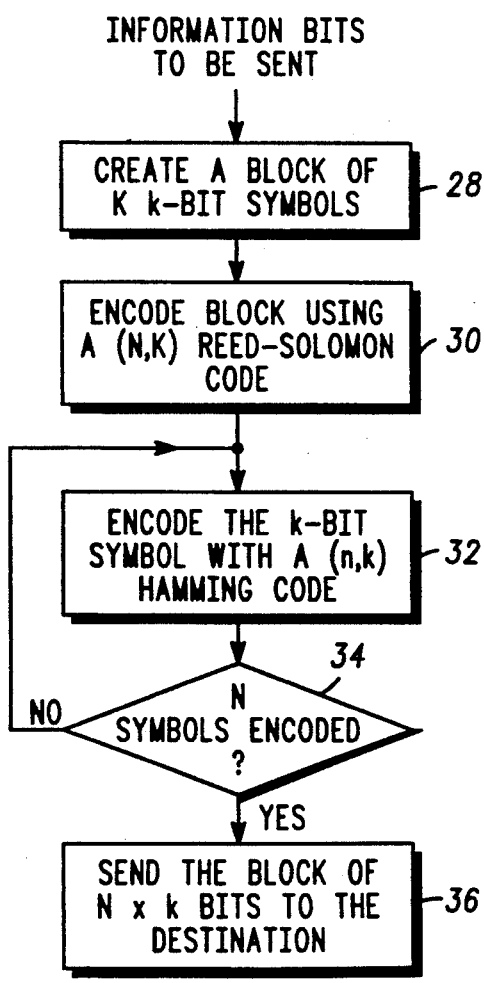
FIG. 5 is a flow chart showing the operation of the encoder portion of FIG. 3.

FIG. 5 is a flow chart showing the operation of the encoder portion of FIGS. 2 and 3, and is representative of software which may be contained in a microprocessor 10 as shown in FIG. 2. The information bits to be sent are formed into a block of six bit symbols at 28. The block of symbols are encoded using a Reed-Solomon code at 30 as shown in FIG. 1. The symbols are subsequently encoded with a Hamming code at 32, and a test is made as to whether all symbols have now been encoded at 34. If all symbols have not been encoded the software loops back to encode the next symbol with a Hamming code. If all of the symbols have been encoded the block is forwarded to the modem to be sent across the channel 14 of FIG. 2.

Figure 6:
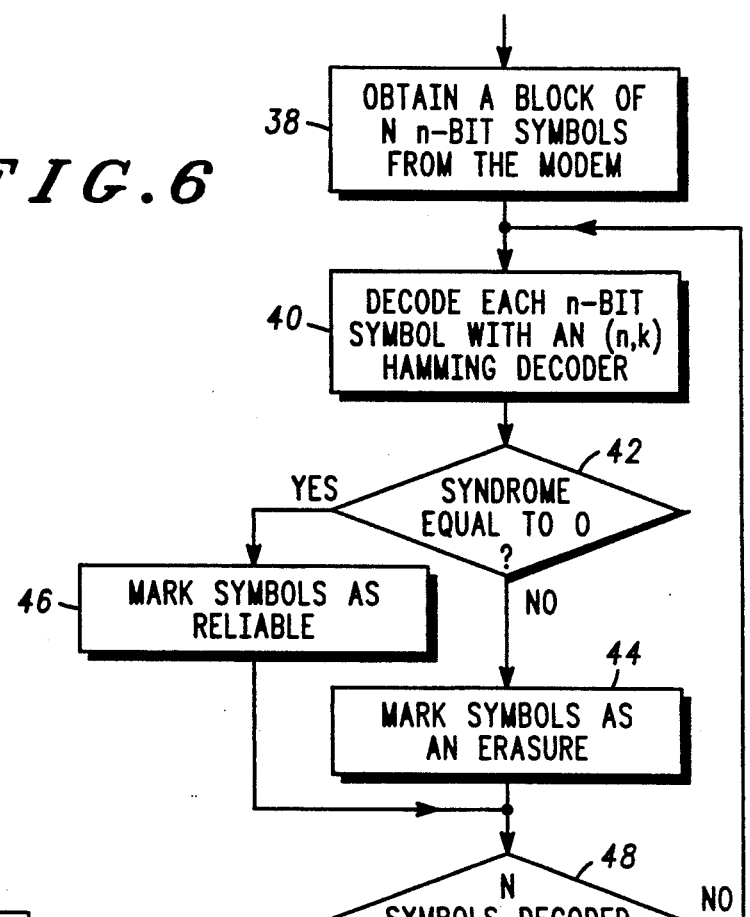
FIG. 6 is a flow chart showing the operation of the decoder portion of FIG. 4.

FIG. 6 is a flow chart showing the operation of the decoder of FIG. 4. A block of symbols is received at 38 from the modem and each six bit symbol with its associated Hamming code is decoded at 40 with a Hamming code decoder or microprocessor 18. When the block is successfully decoded, by the syndrome becoming equal to zero at 42, the symbol is marked as reliable at 44. If the syndrome is not equal to zero, the symbol is marked as an erasure (or a suspected erroneous symbol) at 46. In either event, the outputs of blocks 44 and 46 are examined at 48 to determine whether all of the symbols have now been decoded. If not, the software loops back to begin a Hamming decode again at 40 and the loop is repeated until all symbols have been decoded. When all symbols have been decoded the symbols are passed to a Reed-Solomon errors and erasure decoder at 50 and again the syndrome equal to zero test is made at 52. If the test is successful and the syndrome is equal to zero, the received block of data is correct and if the syndrome is not equal to zero the received block of data is incorrect and, typically, a retransmission will be requested.

I claim:

1. A concatenated coding arrangement for a communication signalling system transmitting data, wherein error correction capabilities are enhanced, comprising, in combination:

means for encoding data to be transmitted with a first code type to form an outer code which is capable of correcting burst errors, correcting erasures, and further detecting if the remaining data is error free, and means for encoding the data and the outer code with a second code type to form an inner code which is capable of correcting random errors and detecting multiple bit errors to designate the erasures, such that the second and the first code types may be cooperatively and sequentially utilized to enhance the error correction capabilities of the communication signalling system without incurring the otherwise requisite coding overhead.

2. A concatenated coding arrangement for a communication signalling system transmitting data, wherein error correction capabilities are enhanced, comprising, in combination:

means for encoding data to be transmitted with a Reed-Solomon Code to form an outer code which is capable of correcting burst errors, correcting erasures, and further detecting if the remaining data is error free, and means for encoding the data and the outer code with a Hamming Code to form an inner code which is capable of correcting random errors and detecting multiple bit errors to designate the erasures, such that the Hamming Code and the Reed-Solomon Code may be cooperatively and sequentially utilized to enhance the error correction capabilities of the communication signalling system without incurring the otherwise requisite coding overhead.

3. In a concatenated coding arrangement for a communication signalling system transmitting data, wherein error correction capabilities are enhanced, a method comprising the steps of:

encoding data to be transmitted with a first code type to form an outer code which is capable of correcting burst errors, correcting erasures, and further detecting if the remaining data is error free, and encoding the data and the outer code with a second code type to form an inner code which is capable of correcting random errors and detecting multiple bit errors to designate the erasures, such that the second and the first code types may be cooperatively and sequentially utilized to enhance the error correction capabilities of the communication signalling system without incurring the otherwise requisite coding overhead.

4. In a concatenated coding arrangement for communication signalling system transmitting data, wherein error correction capabilities are enhanced, a method comprising the steps of:

encoding data to be transmitted with a Reed-Solomon Code to form an outer code which is capable of correcting burst errors, correcting erasures, and further detecting if the remaining data is error free;

encoding the data and the outer code with a Hamming Code to form an inner code which is capable of correcting random errors and detecting multiple bit errors to designate the erasures, such that the Hamming Code and the Reed-Solomon Code may be cooperatively and sequentially utilized to enhance the error correction capabilities of the communication signalling system without incurring the otherwise requisite coding overhead.

5. A decoding arrangement for a data communications system sending data as a concatenated encoded bit stream including the data encoded as an outer code further encoded as an inner code wherein error correction capabilities are enhanced, comprising:

inner means for decoding an inner code including errors to provide a decoded outer code with all single errors corrected and a substantial number of higher order error patterns detected and marked by a corresponding erasure flag; and outer means, responsive to said decoded outer code and said corresponding erasure flags for decoding said decoded outer code to provide decoded data, with a higher order error pattern corrected based on said corresponding erasure flag.

6. A decoding arrangement for a data communications system sending data as a concatenated encoded bit stream including the data encoded as an outer code further encoded as an inner code wherein error correction capabilities are enhanced, comprising:

inner means for decoding an inner code including errors with a Hamming decoder to provide a decoded outer code with all single errors corrected and a substantial number of higher order error patterns detected and marked by a corresponding erasure flag; and outer means, responsive to said decoded outer code and said corresponding erasure flags for decoding said decoded outer code with a Reed-Solomon decoder to provide decoded data, with a higher order error pattern corrected based on said corresponding erasure flag.

7. In a decoding arrangement for a data communications system sending data as a concatenated encoded bit stream including the data encoded as an outer code further encoded as an inner code wherein error correction capabilities are enhanced, a method including the steps of:

decoding an inner code including errors to provide a decoded outer code with all single errors corrected and a substantial number of higher order error patterns detected and marked by a corresponding erasure flag; and decoding, responsive to said decoded outer code and said corresponding erasure flags, said decoded outer code to provide decoded data, with a higher order error pattern corrected based on said corresponding erasure flag.

* * * * *